United States Patent [19]

Kubo et al.

[11] 4,115,748

[45] Sep. 19, 1978

[54] MOS IC OSCILLATION CIRCUIT

[75] Inventors: Daijiro Kubo, Yamato; Masaru Hashimoto, Ayase, both of Japan

[73] Assignee: Tokyo Shibaura Electric Co., Ltd., Tokyo, Japan

[21] Appl. No.: 778,567

[22] Filed: Mar. 17, 1977

[30] Foreign Application Priority Data

Mar. 18, 1976 [JP] Japan ............................. 51-31680[U]

[51] Int. Cl.² ....................... H03K 3/295; H03K 3/353
[52] U.S. Cl. .................................... 331/111; 307/290; 307/304; 331/108 D
[58] Field of Search ............... 331/111, 108 C, 108 D; 307/290, 303, 304

[56] References Cited

U.S. PATENT DOCUMENTS

| 4,001,722 | 1/1977 | Patel et al. | 331/111 |
| 4,023,122 | 5/1977 | Oura | 331/111 |

Primary Examiner—Siegfried H. Grimm
Attorney, Agent, or Firm—Finnegan, Henderson, Farabow & Garrett

[57] ABSTRACT

A MOS IC oscillation circuit comprising a circuit including a MOS FET and a resistor connected in series between a power source and ground, a capacitor one end of which is connected to the junction between both said components and the other end is connected to said power source or the ground, and a Schmitt trigger circuit receiving an input signal from the junction and produces an output signal which controls "on-off" operation of the MOS FET.

9 Claims, 8 Drawing Figures

F I G. 1
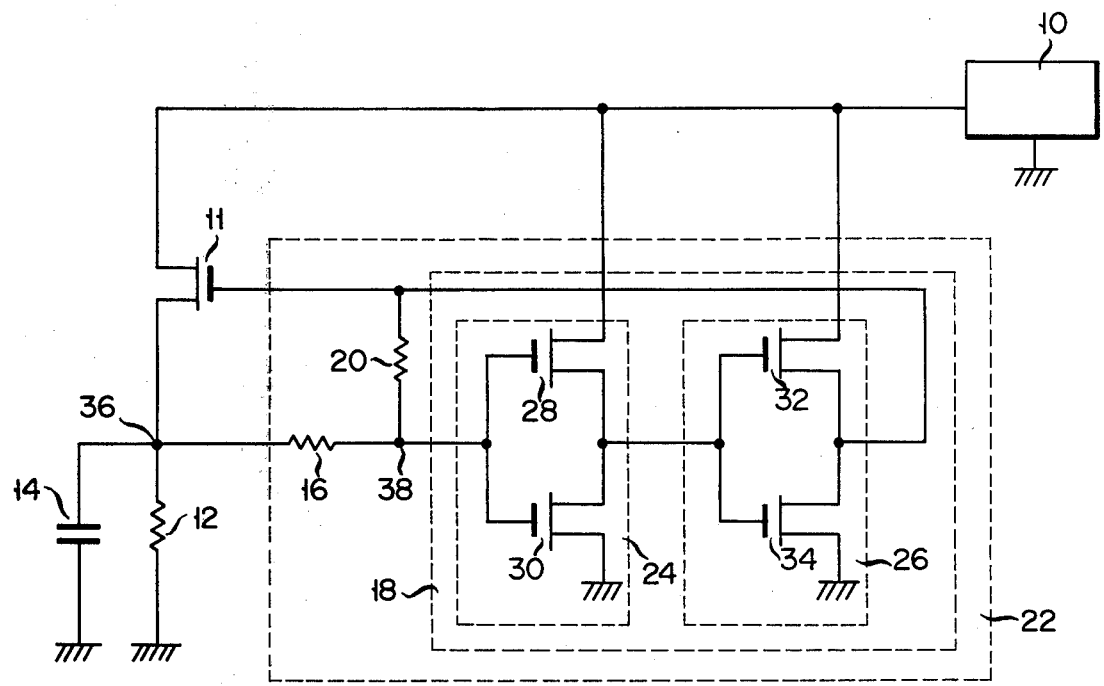
F I G. 2
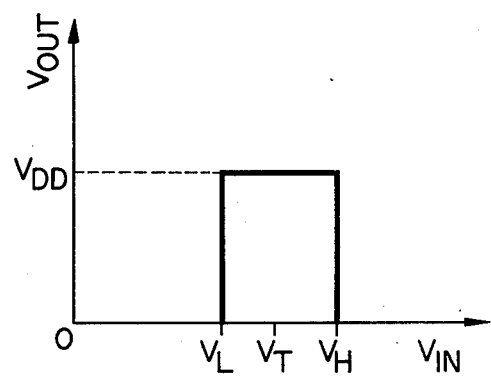

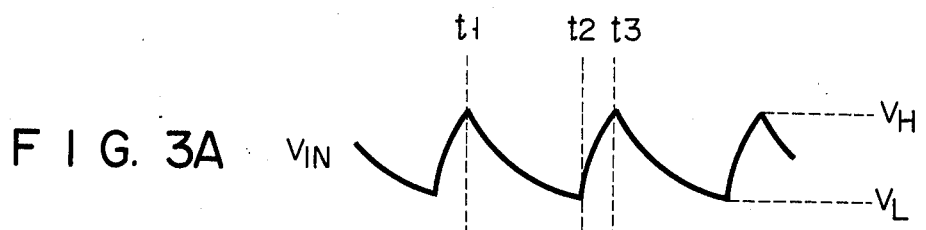
F I G. 3A
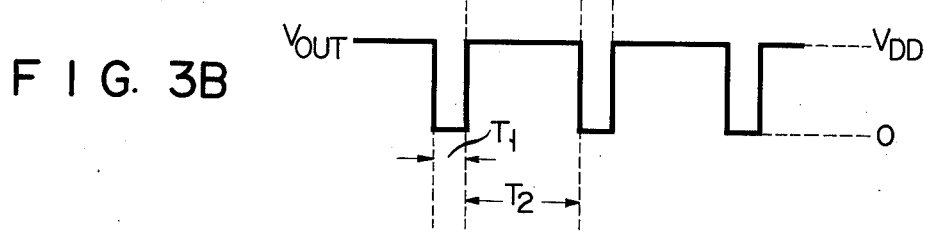
F I G. 3B
F I G. 4
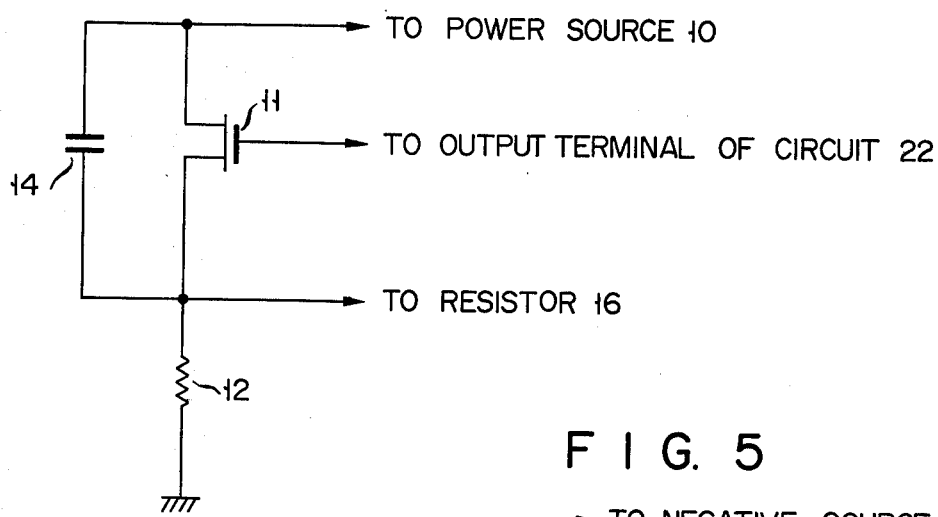
F I G. 5
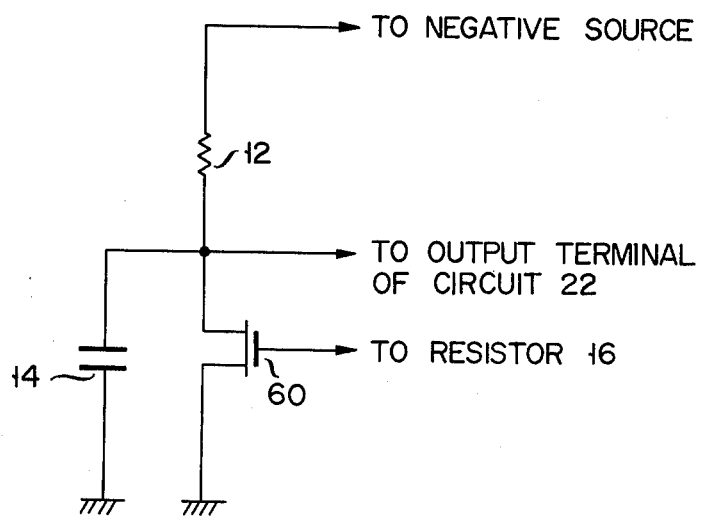

MOS IC OSCILLATION CIRCUIT

BACKGROUND OF THE INVENTION

The present invention relates to an oscillation circuit which is suitable for a MOS FET integration.

An oscillation circuit comprising a MOS FET (metal oxide semiconductor field effect transistor) integrated circuit (hereinafter referred to as an MOS IC oscillation circuit) not requiring a high precision for the oscillation frequency is disclosed, for example, in "an article on Integrated Circuit C$^2$ MOS", 2nd edition, on page 450, published by TOKYO SHIBAURA ELECTRIC CO. LTD., 1976, July. The MOS IC oscillation circuit described in the book uses three terminal pins for connecting external parts. It is desirable, however, for the integrated circuit that required terminal pins be minimal in number.

SUMMARY OF THE INVENTION

Accordingly, a principal object of the present invention is to provide a MOS IC oscillation circuit with a minimal number of terminal pins.

In one preferred form of the invention, a MOS IC oscillation circuit comprising a series circuit including a MOS FET and a resistor connected in series between a power source and ground, a capacitor one end of which is connected to the junction between both said components and the other end is connected to said power source or the ground, and a MOS FET receiving an input signal from the junction and produces an output signal which controlls "on-off" operation of the MOS FET.

Other objects and features of the present invention will be apparent from the following description taken in connection with the accompanying drawings, in which:

BRIEF DESCRIPTION OF THE DRAWINGS

FIG. 1 shows an embodiment of a MOS IC oscillation circuit according to the present invention;

FIG. 2 shows a graph chart of the input vs. output voltage characteristic curve of a Schmitt trigger circuit;

FIGS. 3A and 3B show waveforms of the input and output voltages of the Schmitt trigger circuit; and FIGS. 4 to 7 show other embodiments of the MOS IC oscillation circuit of the present invention.

DESCRIPTION OF THE PREFERRED EMBODIMENTS

Figure 6:
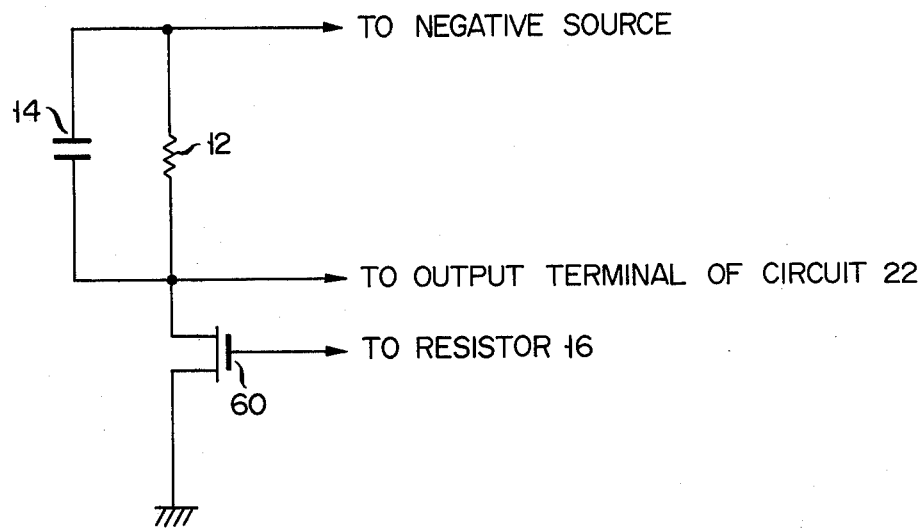

Referring now to FIG. 1, there is shown a MOS IC oscillation circuit of the present invention. As shown, a p-channel MOS FET 11 and a resistor 12 are connected in series between a power source 10 of $V_{DD}$ and the ground. The drain of the MOS FET 11 is connected to the positive side of the power source 10, and the source thereof is connected to one end of the resistor 12. The other end of the resistor 12 is connected to the ground. A capacitor 14 is connected across the resistor 12. Between the gate and source of the MOS FET 11 is connected a Schmitt trigger circuit 22 including a resistor 16 one end of which is connected to the source of the MOS FET 11, an amplifier 18 the input terminal of which is connected to the other end of the resistor 16, and the output is connected to the gate of the MOS FET 11, and a resistor 20 inserted between the input and output of the amplifier 18.

The amplifier 18 includes a couple of inverters 24 and 26 each comprised of complementary MOS FET's. The inverter 24 is comprised of complementary MOS FET's 28 and 30 the gates of which are connected to the resistor 16, the MOS FET's being connected in cascade between the positive side of the power source 10 and the ground. The inverter 26 is comprised of a complementary MOS FET's 32 and 34 which are cascade-connected between the positive side of the power source 10 and the ground. The gates of the MOS FET's 32 and 34 are commonly connected to the drain of the MOS FET 28 and the drain of the MOS FET 30. The drain of the MOS FET 32 and the drain of the MOS FET 34 are connected to the gate of the MOS FET 11.

The MOS FET 11 serves as an element to charge the capacitor 14. The resistor 12 is used to provide a discharging path to the charges stored in the capacitor 14.

The resistor 12 and the capacitor 14 are external components. A terminal pin for mounting these components is formed at the junction 36 between the resistor 12 and the source of the MOS FET 11. The resistor 12 may be formed as an internal component.

The amplifier 18 is operated such that, when a voltage in excess of a threshold voltage $V_T$ is applied to the input terminal thereof, the output becomes $V_{DD}$, and when the input voltage is below the threshold voltage, the output becomes a substantial zero volt. It is preferable that the threshold voltage $V_T$ of the amplifier 18 equals to that of the MOS FET 11.

The input vs. output relation of the Schmitt trigger circuit 22 is shown in FIG. 2. In the Figure, the input voltage $V_{IN}$ is expressed on the abscissa and the output voltage $V_{OUT}$ on the ordinate. $V_H$ is the voltage value when the output voltage $V_{OUT}$ changes from $V_{DD}$ to 0 V. $V_L$ is the voltage value when the output voltage $V_{OUT}$ changes from 0 V to $V_{DD}$. The voltages $V_H$ and $V_L$ are expressed by the following equations.

$$V_H = V_T + V_T \frac{R2}{R3} \quad (1)$$

$$V_L = V_T - (V_{DD} - V_T)\frac{R2}{R3} \quad (2)$$

where "R2" denotes the resistance of the resistor R16, and R3 denotes the resistance of the resistor 20.

There will now be described the operation of the MOS IC oscillation circuit of FIG. 1. Reference will now be made to FIGS. 3A and 3B.

Assume now that the output voltage $V_{OUT}$ changes from zero to $V_{DD}$ at time $t_1$. At this time, the MOS FET 11 is turned off and electric charges stored in the capacitor 14 are discharged through the resistor 12 so that the input voltage $V_{IN}$ reduces. When the input voltage $V_{IN}$ drops below $V_L$ (at time $t_2$), the potential at the input terminal 38 of the amplifier 18 becomes below the threshold voltage $V_T$ and thus the output voltage $V_{OUT}$ becomes about zero. The positive feed-back of the output voltage $V_{OUT}$ through the resistor 20 further reduces the potential at the input terminal 38 of the amplifier 18. In response to the reduction of the potential, the MOS FET 11 is turned on and the current flowing through the source-drain circuit of the MOS FET 11 starts to charge the capacitor 14. With the charging, the input voltage $V_{IN}$ increases gradually. When the input voltage $V_{IN}$ exceeds the voltage $V_H$, the potential at the input terminal 38 of the amplifier 18 becomes higher than the threshold voltage $V_T$, the output voltage $V_{OUT}$ of the amplifier 18 changes to $V_{DD}$. At this time, the MOS FET 11 is turned off and electric charges stored in the capacitor 14 start to discharge through the resistor 12. In this manner, the oscillation continues.

When the current flowing through the MOS FET 11 is set to be satisfactorily larger than the discharge current flowing through the resistor 12, the period of time T1 is considerably short. Therefore, the oscillation frequency is substantially determined by the time period T2 (FIGS. 3A and 3B). The period T2 is determined by the time constant of the product of the capacitance C of the capacitor 14 and the resistance R of the resistor 12, and the voltage level ($V_H$-$V_L$). More precisely, From the equations (1) and (2), we obtain $$V_H - V_L = (R2/R3) \times V_{DD} \qquad (3)$$

The time period T2, when, due to the discharge of the capacitor 14, the input voltage $V_{IN}$ changes from the voltage $V_H$ to $V_L$ is given.

$$T2 = CR/\log(V_H/V_L) \qquad (4)$$

where "c" denotes the capacitance of the capacitor 14, and "R1" denotes the resistance of resistor 12.

From the equations (1) and (2), the ratio $V_H/V_L$ is given $$\frac{V_H}{V_L} = \frac{V_T(R2 + R3)}{V_T(R2 + R3) - R2V_{DD}} \qquad (5)$$

By substituting the equation (5) into (4), we have $$T2 = CR1 \log \left( \frac{V_T(R2 + R3)}{V_T(R2 + R3) - R2\,V_{DD}} \right) \qquad (6)$$

$$= - CR1 \log \left( 1 - \frac{R2}{(R2 + R3)} \cdot \frac{V_{DD}}{V_T} \right)$$

The time T1 required for the input voltage $V_{IN}$ to rise from $V_L$ to $V_H$ is expressed as follows:

$$T1 = - CR4 \log \left( \frac{V_{DD} - V_H}{V_{DD} - V_L} \right) \qquad (7)$$

In equation (7), "R4" denotes the resistance which the transistor 11 exhibits when turned on. If equations (1) and (2) are incorporated into equation (7), equation (7) is transformed as follows:

$$T1 = - CR4 \log \left( \frac{R3}{R2 + R3} \frac{V_{DD}}{V_{DD} - V_T} - \frac{V_T}{V_{DD} - V_T} \right) \qquad (8)$$

The threshold voltage $V_T$ varies in proportion to $V_{DD}$. Thus, $V_{DD}/V_T$ in equation (6) and $V_{DD}/V_{DD}$-$V_T$, $V_T/V_{DD}$-$V_T$ in equation (8) become substantially constant. As a result, the time period T2, which in effect determines the stability of oscillation frequency, becomes constant. In addition, the time period T1 also becomes constant. For this reason the oscillation frequency is made extremely stable. The resistor 12 and the capacitor 14 are the external components in FIG. 1, and thus if these external components are variable ones, the oscillation frequency of the oscillator is variable.

From the foregoing description, it will be seen that an oscillation circuit with only one terminal pin is realized, as shown in FIG. 1 with a simpler construction than the conventional one.

The capacitor 14 may be connected across the MOS FET 11, as shown in FIG. 4. In this case, the MOS FET 11 serves as an element providing a discharge path and the resistor 12 as an element providing a charge path.

Further, although the p-channel MOS FET is used in the embodiment of FIG. 1, an n-channel MOS FET may be employed instead of the former, as shown in FIG. 5. The n-channel MOS FET 60 is connected to the ground. In this example, the MOS FET 60 serves as an element providing a discharge path and the resistor 12 as an element providing a charge path (FIG. 5).

FIG. 6 shows a modification of the FIG. 5 circuit. In this example, the capacitor 14 is connected across the resistor 12. In this case, the MOS FET 60 serves as an element providing a charge path and the resistor 12 as an element providing a discharge path.

Figure 7:
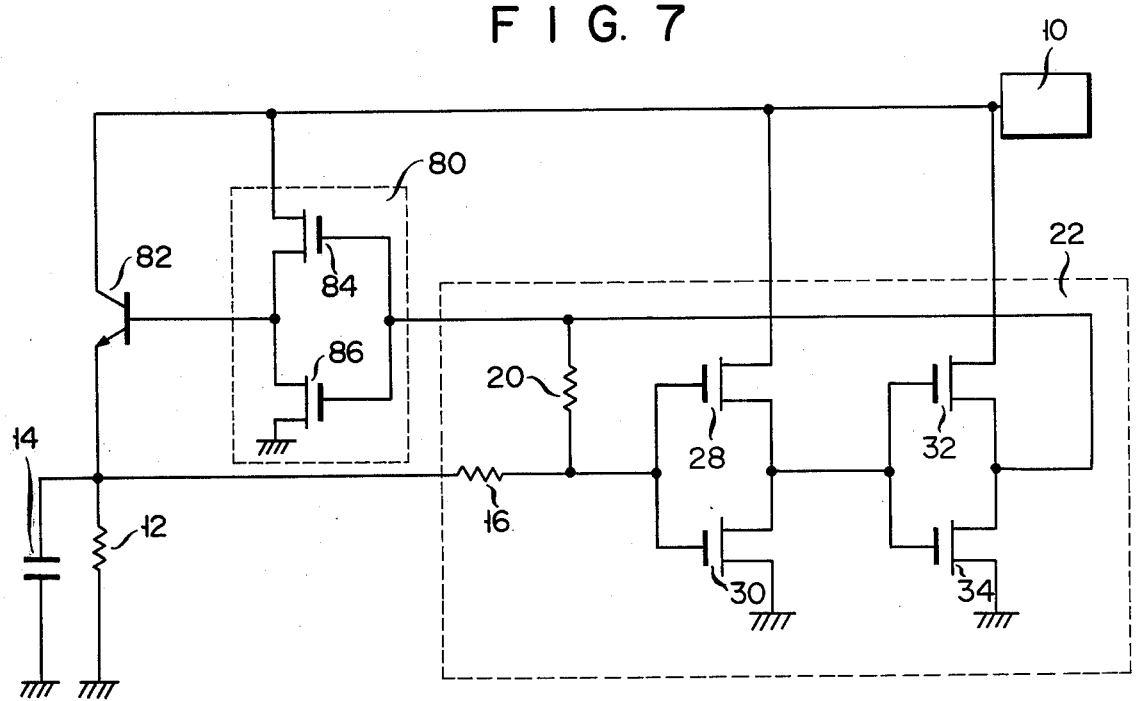

Turning now to FIG. 7, there is shown another embodiment of the present invention. In this example, a bipolar transistor 82 and an inverter 80 are used in place of the MOS FET 11 in the FIG. 1 circuit. The inverter 80 is comprised of complementary type MOS FET's 84 and 86. The gates of the MOS FET's 84 and 86 are commonly connected to the output side of the Schmitt trigger circuit 22. The drain of the MOS FET 84 and the drain of the MOS FET 86 are connected to the base of the NPN transistor 82. The operation of the oscillation circuit is substantially equal to that of FIG. 1 circuit, thus description thereof being emitted. It is to be noted that this example also needs only one external pin with a simple construction. The bipolar transistor 82 may be formed in the same process as that of the MOS FET though with minor modification. That is, an additional manufacturing step is unnecessary for the bipolar transistor. The capacitor 14 may be connected across the NPN transistor 82.

Various other modifications of the disclosed embodiments will become apparent to those skilled in the art without departing from the spirit and scope of the invention as defined by the appended claims.

What is claimed is:

1. A complementary MOS IC oscillation circuit comprising:

a power source having a first terminal of a first potential and a second terminal of a second potential;

a series circuit including an active circuit having a control terminal and a first resistor means which are connected in series to each other to form a junction and said series connected between the first and second terminals of said power source with said active circuit being connected to said first terminal and said first resistor means being connected to said second terminal;

a Schmitt trigger circuit including cascade-connected first and second complementary MOS inverters each comprising complementary MOS FET's, a second resistor means provided between the junction of said active circuit and first resistor means and the input of said first complementary MOS inverter, and a third resistor means provided between the output of said second complementary MOS inverter and the input of said first complementary MOS inverter, said Schmitt trigger circuit adapted to receive an input signal from said junction between said active circuit and first resistor means and to provide an output signal to the control terminal of said active circuit for controlling the ON-OFF operation of said active circuit; and a capacitor means one end of which is connected to said junction between said active circuit and first resistor means and the other end of which is connected to either one of the first and second terminals of said power source.

2. A complementary MOS IC oscillation circuit according to claim 1, in which said first potential of the first terminal is higher than said second potential of the second terminal, said active circuit is a p-channel type MOS FET, and said other end of said capacitor means is connected to said first terminal.

3. A complementary MOS IC oscillation circuit according to claim 1, in which said first potential of the first terminal is higher than said second potential of the second terminal, said active circuit is a p-channel type MOS FET, and said other end of said capacitor means is connected to said second terminal.

4. A complementary MOS IC oscillation circuit according to claim 1, in which said first potential of the first terminal is lower than said second potential of the second terminal, said active circuit is an n-channel type MOS FET, and said other end of said capacitor means is connected to said first terminal.

5. A complementary MOS IC oscillation circuit according to claim 1, in which said first potential of the first terminal is lower than said second potential of the second terminal, said active circuit is an n-channel type MOS FET, and said other end of said capacitor means is connected to said second terminal.

6. A complementary MOS IC oscillation circuit according to claim 1, in which said first potential of the first terminal is higher than said second potential of the second terminal, said active circuit includes an NPN type transistor having a collector and emitter connected to said first terminal and to said junction respectively, a third inverter formed of complementary MOS FET's, said third inverter having its input terminal connected to an output terminal of said Schmitt trigger circuit and its output terminal connected to the base of said NPN type transistor, and said other end of said capacitor means is connected to said first terminal.

7. A complementary MOS IC oscillation circuit according to claim 1, in which said first potential of the first terminal is higher than said second potential of the second terminal, said active circuit includes an NPN type transistor connected between said first terminal and said junction, said oscillation circuit further having a third inverter formed of complementary MOS FET's, said third inverter having its input terminal connected to an output terminal of said Schmitt trigger circuit and its output terminal connected to the base of said NPN type transistor, and said other end of said capacitor means is connected to said second terminal.

8. A complementary MOS IC oscillation circuit according to claim 1, in which said first potential of the first terminal is lower than said second potential of the second terminal, said active circuit includes a PNP type transistor connected between said first terminal and said junction, said oscillation circuit further having a third inverter formed of complementary MOS FET's, said third inverter having its input terminal connected to an output terminal of said Schmitt trigger circuit and its output terminal connected to the base of said PNP type transistor, and said other end of said capacitor means is connected to said first terminal.

9. A complementary MOS IC oscillation circuit according to claim 1, in which said first potential of the first terminal is lower than said second potential of the second terminal, said active circuit includes a PNP type transistor connected between said first terminal and said junction, said oscillation circuit further having a third inverter formed of complementary MOS FET's said third inverter having its input terminal connected to an output terminal of said Schmitt trigger circuit and its output terminal connected to the base of said PNP type transistor, and said other end of said capacitor means is connected to said second terminal.

* * * * *